US012660672B2

(12) United States Patent
Chiang

(10) Patent No.: US 12,660,672 B2
(45) Date of Patent: Jun. 16, 2026

(54) ANTENNA PACKAGE

(71) Applicant: MEDIATEK INC., Hsin-Chu (TW)

(72) Inventor: Chung-Hsin Chiang, Hsinchu (TW)

(73) Assignee: MEDIATEK INC., Hsinchu City (TW)

( * ) Notice: Subject to any disclaimer, the term of this patent is extended or adjusted under 35 U.S.C. 154(b) by 508 days.

(21) Appl. No.: 18/109,266

(22) Filed: Feb. 14, 2023

(65) Prior Publication Data

US 2023/0290700 A1 Sep. 14, 2023

Related U.S. Application Data

(60) Provisional application No. 63/317,562, filed on Mar. 8, 2022.

(51) Int. Cl.
| *H10W 74/10* | (2026.01) |
| *H10W 20/20* | (2026.01) |
| *H10W 44/20* | (2026.01) |
| *H10W 70/60* | (2026.01) |
| *H10W 74/01* | (2026.01) |

(52) U.S. Cl.
CPC .......... *H10W 74/117* (2026.01); *H10W 20/20* (2026.01); *H10W 44/20* (2026.01); *H10W 70/614* (2026.01); *H10W 74/016* (2026.01); *H10W 74/129* (2026.01); *H10W 44/248* (2026.01)

(58) Field of Classification Search
None
See application file for complete search history.

(56) References Cited

U.S. PATENT DOCUMENTS

| 2013/0292808 A1 | 11/2013 | Yen |
| 2021/0343664 A1 | 11/2021 | Chang |
| 2022/0029271 A1* | 1/2022 | Cho ........................ H01Q 23/00 |
| 2022/0037306 A1* | 2/2022 | You .......................... H01L 24/24 |

FOREIGN PATENT DOCUMENTS

| TW | 201434203 A | 9/2014 |
| TW | 201630153 A | 8/2016 |

* cited by examiner

*Primary Examiner* — Jay C Chang
(74) *Attorney, Agent, or Firm* — Winston Hsu

(57) ABSTRACT

An antenna package includes a redistribution layer (RDL) structure having a top surface and a bottom surface opposite to the top surface and a TSV die disposed on the top surface of the RDL structure and encapsulated by a molding compound. The TSV die includes an active side and a rear side, and a sidewall of the TSV die is covered with the molding compound. The TSV die includes a plurality of through-silicon-vias including RF signal vias and ground vias penetrating through an entire thickness of the TSV die. An antenna structure is disposed on the rear side of the TSV die and is connected to the RF signal vias and ground vias.

10 Claims, 9 Drawing Sheets

ANTENNA PACKAGE

CROSS REFERENCE TO RELATED APPLICATIONS

This application claims the benefit of U.S. Provisional Application No. 63/317,562, filed on Mar. 8, 2022. The content of the application is incorporated herein by reference.

BACKGROUND

The present disclosure relates generally to the field of semiconductor packaging. More particularly, the present disclosure relates to ultra-high frequency antenna packages with through-silicon-via (TSV) die.

Next-generation communication systems and wearable technologies aim to achieve high data rates, low energy consumption, and massive connections because of the extensive increase in the number of Internet-of-Things (IoT) and wearable devices. These devices will be employed for many services such as cellular, environment monitoring, telemedicine, bio-medical, and smart traffic, etc. Therefore, it is challenging for the current communication devices to accommodate such a high number of services.

Antenna in Package (AiP) or antenna on Package (AoP) has emerged as the mainstream antenna packaging technology for various millimeter-wave (mmWave) applications. AiP technology is an antenna packaging solution that implements an antenna or antennas in an IC package that can carry a bare RF chip. The AiP can be further integrated with front-end components (e.g., power amplifiers (PA) or low-noise amplifiers (LNA)), switches, filters and even power management integrated circuit (PMIC) to form an antenna module using System-in-Package (SiP) technologies.

A typical AiP includes a RF chip attached to a package substrate with solder balls for connection to a main board. An array of antennas sits atop the upper portion of the package substrate, allowing wireless communication and detection. Flip-chip techniques are utilized to connect the RF chip to the substrate, thereby mitigating the interconnect loss. However, the routing loss of the antenna in a conventional AiP is high due to the routing design of the transmission line between the RF chip and the antenna.

SUMMARY

It is one object of the present disclosure to provide an improved antenna-in-package in order to solve the above-mentioned prior art deficiencies or shortcomings.

One aspect of the present disclosure provides an antenna package including a redistribution layer (RDL) structure having a top surface and a bottom surface opposite to the top surface; a TSV die disposed on the top surface of the RDL structure, wherein the TSV die comprises an active side and a rear side, wherein the TSV die comprises a plurality of through-silicon-vias comprising RF signal vias and ground vias penetrating through an entire thickness of the TSV die; and an antenna structure disposed on the rear side of the TSV die and connecting to the RF signal vias and ground vias.

According to some embodiments, the RDL structure comprises redistributed conductive layers disposed in one or more dielectric layers.

According to some embodiments, the redistributed conductive layers comprise connection patterns at the top surface and pad patterns at the bottom surface, and wherein solder balls are disposed on the pad patterns at the bottom surface of the RDL structure.

According to some embodiments, the TSV die comprises a radio frequency (RF) chip.

According to some embodiments, the TSV die comprises a circuit region on its active side, and wherein input/output (I/O) terminals in the circuit region are fanned out of a chip area of the TSV die and re-distributed through the RDL structure.

According to some embodiments, the plurality of TSVs connects the circuit region with the antenna structure on the rear side of the TSV die.

According to some embodiments, the antenna structure comprises feed lines connected to the RF signal vias, a ground element layer connected to the ground vias, coupling slots disposed in the ground element layer and directly above the feed lines, and a first dielectric layer on the feed lines.

According to some embodiments, the antenna structure further comprises a second dielectric layer on the first dielectric layer, and first patch elements on the second dielectric layer.

According to some embodiments, the first patch elements are directly connected to the feed lines through interconnect structures.

According to some embodiments, the interconnect structures comprise copper pillars or through mold vias.

According to some embodiments, the second dielectric layer is a multi-layer structure.

According to some embodiments, the second dielectric layer comprises a lower dielectric layer and an upper dielectric layer.

According to some embodiments, the lower dielectric layer and the upper dielectric layer have different compositions.

According to some embodiments, the lower dielectric layer and the upper dielectric layer have different dielectric constants.

According to some embodiments, the lower dielectric layer has a dielectric constant that is lower than that of the upper dielectric layer.

According to some embodiments, the antenna structure comprises feed lines connected to the RF signal vias, a ground element layer connected to the ground vias, coupling slots disposed in the ground element layer and directly above the feed lines, a first dielectric layer, a second dielectric layer on the first dielectric layer, lower patch elements on the second dielectric layer, a third dielectric layer on the second dielectric layer, and upper patch elements on the third dielectric layer.

According to some embodiments, the antenna structure comprises feed lines connected to the RF signal vias, a ground element layer connected to the ground vias, coupling slots disposed in the ground element layer and directly above the feed lines, a first dielectric layer, a second dielectric layer on the first dielectric layer, and a planar structure on the second dielectric layer.

According to some embodiments, the planar structure comprises a frequency selective surface (FSS) structure.

According to some embodiments, the planar structure comprises a metamaterial.

According to some embodiments, the antenna structure comprises feed lines connected to the RF signal vias, a ground element layer connected to the ground vias, coupling slots disposed in the ground element layer and directly above the feed lines, a first dielectric layer, a second dielectric layer on the first dielectric layer, patch elements on the second dielectric layer, a third dielectric layer on the second dielectric layer, and a planar structure on the third dielectric layer.

According to some embodiments, the planar structure comprises a frequency selective surface (FSS) structure.

According to some embodiments, the planar structure comprises a metamaterial.

According to some embodiments, the antenna structure comprises feed lines connected to the RF signal vias, a ground element layer connected to the ground vias, coupling slots disposed in the ground element layer and directly above the feed lines, a first dielectric layer, and an antenna substrate mounted on the ground element layer.

According to some embodiments, the antenna substrate comprises patch elements on an upper surface of the antenna substrate.

According to some embodiments, the antenna substrate is electrically connected to the ground element layer through a plurality of conductive elements.

According to some embodiments, the antenna substrate comprises a single-layer substrate or a multi-layer substrate.

According to some embodiments, the antenna substrate comprises glass, ceramic or organic materials.

According to some embodiments, the antenna structure comprises feed lines connected to the RF signal vias, a ground element layer connected to the ground vias, coupling slots disposed in the ground element layer and directly above the feed lines, a first dielectric layer, and multiple antenna substrates mounted on the ground element layer.

According to some embodiments, at least one passive element is disposed on the top surface of the RDL structure around the TSV die and is coupled to the connection patterns at the top surface of the RDL structure.

According to some embodiments, the at least one passive element comprises a decoupling capacitor, an inductor, or a resistor.

According to some embodiments, the TSV die is encapsulated by an insulating material, and a sidewall of the TSV die is covered with the insulating material.

According to some embodiments, the insulating material comprises a molding compound.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

4

Figure 4:
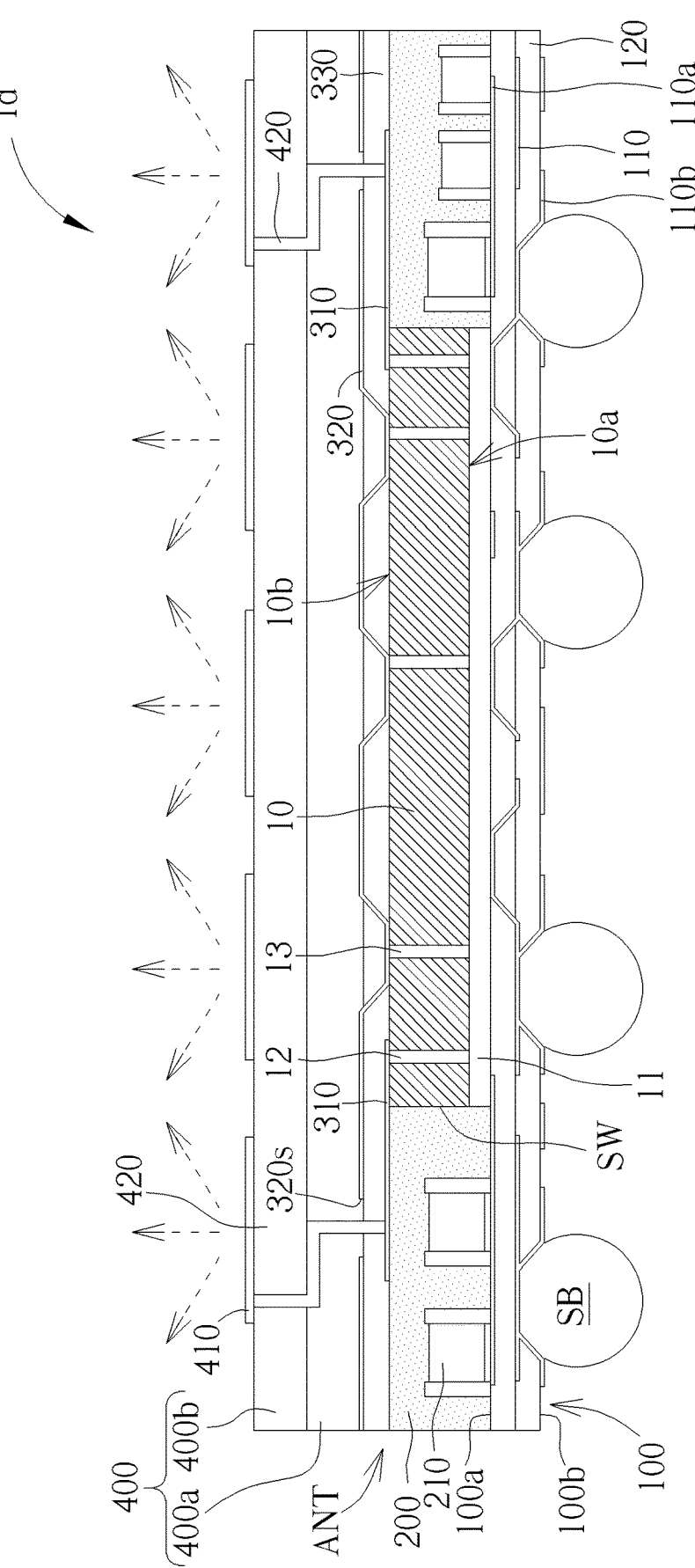
Figure 5:
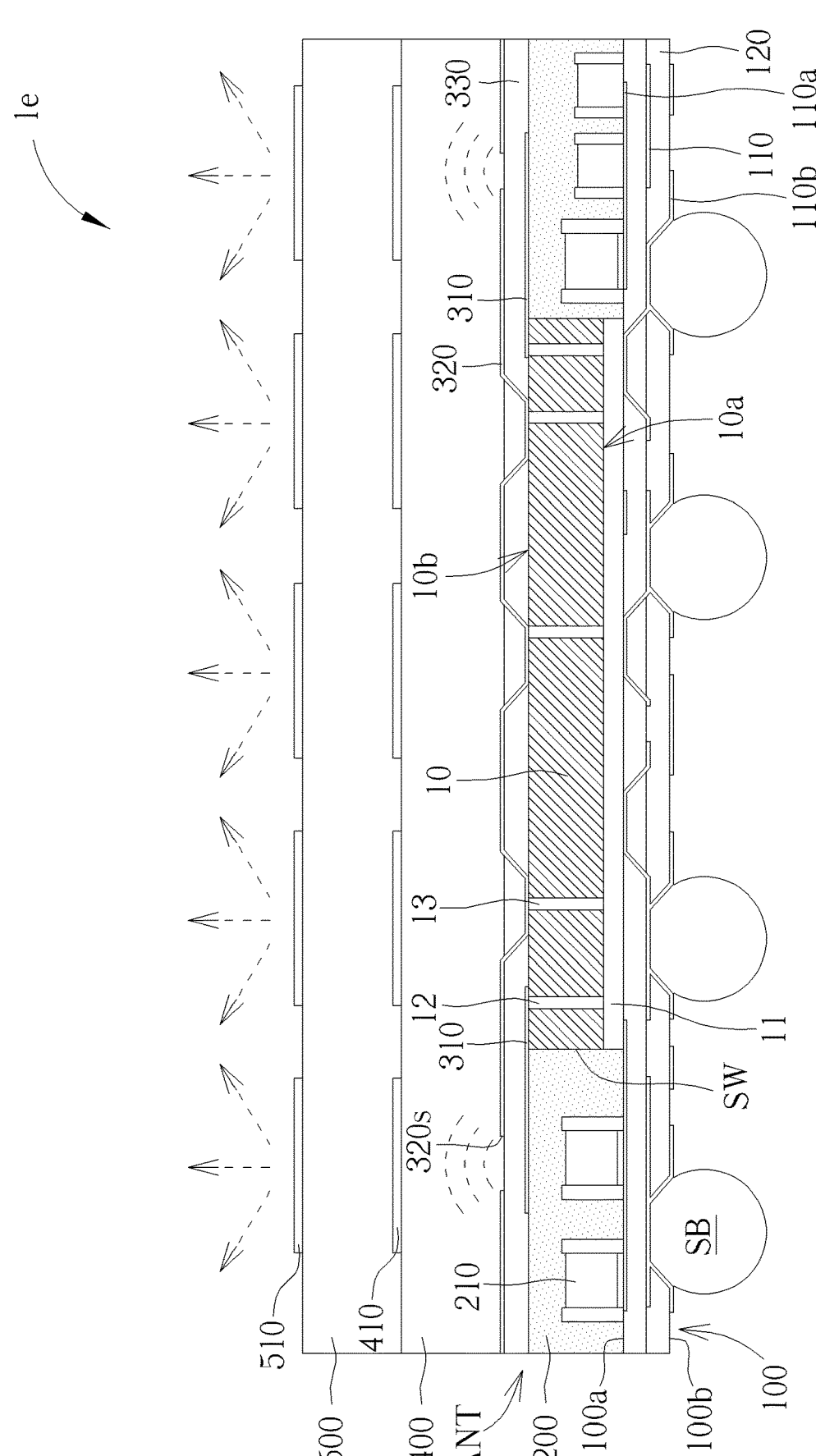
Figure 6:
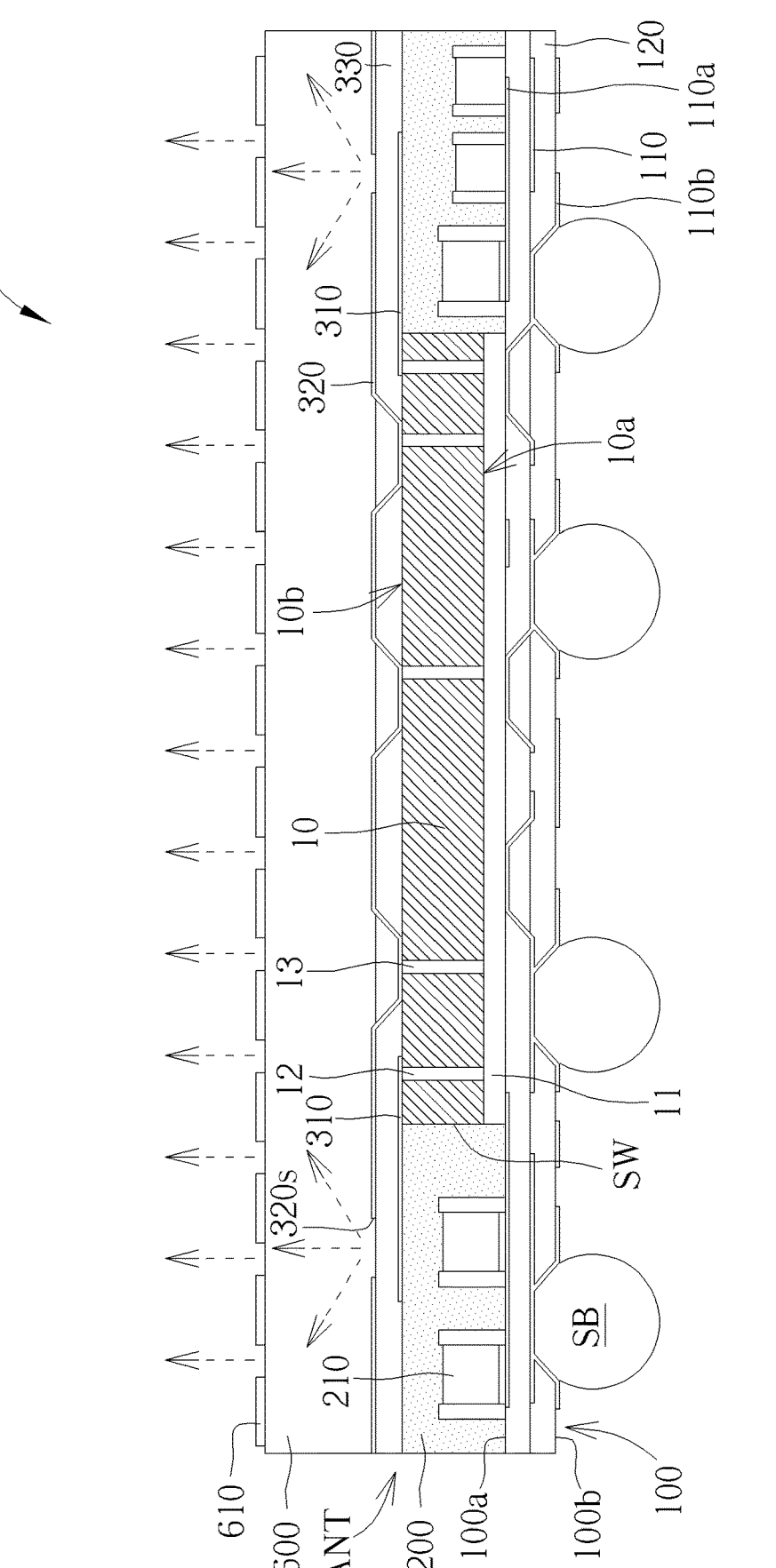
Figure 7:
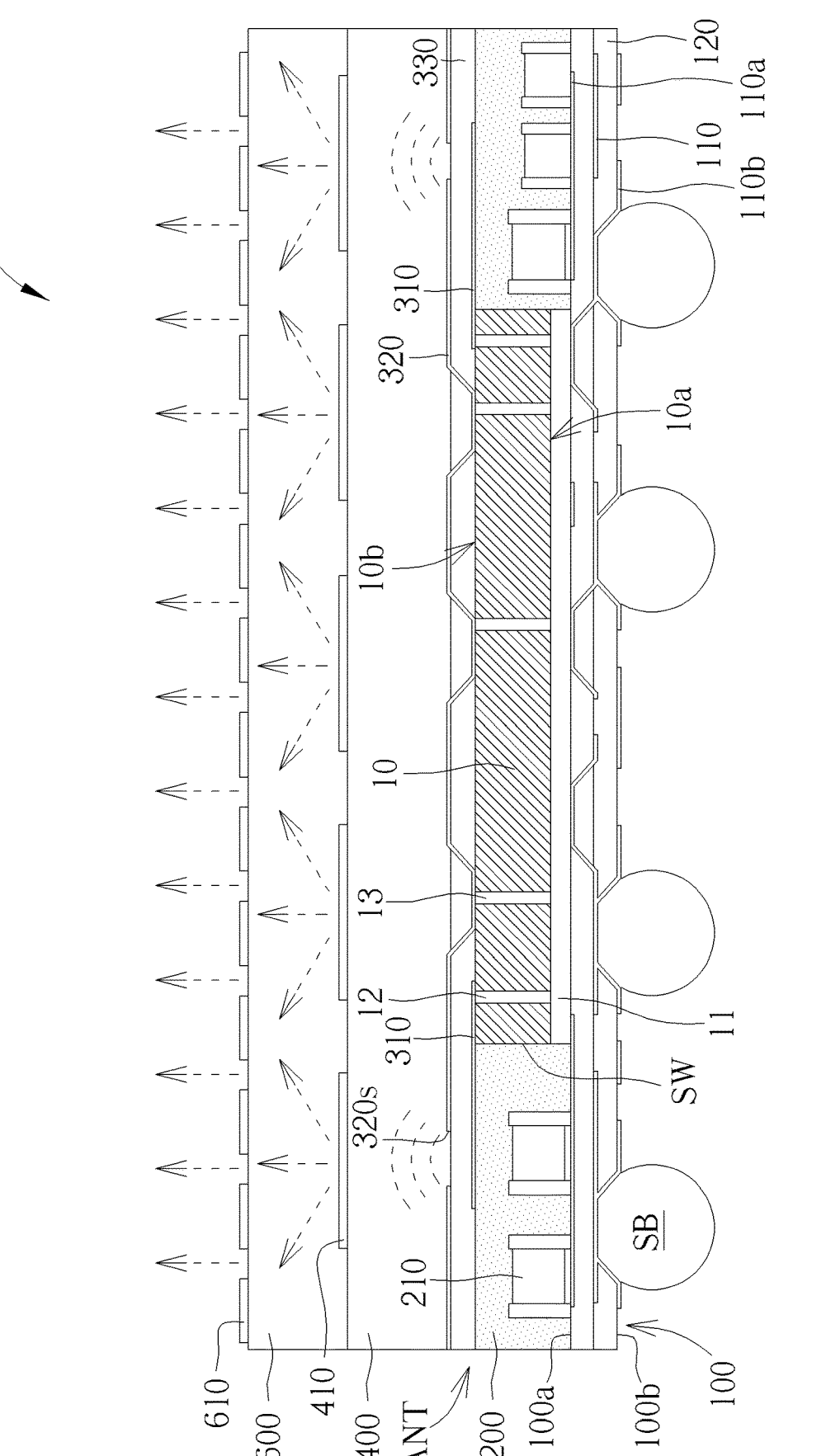
Figure 8:
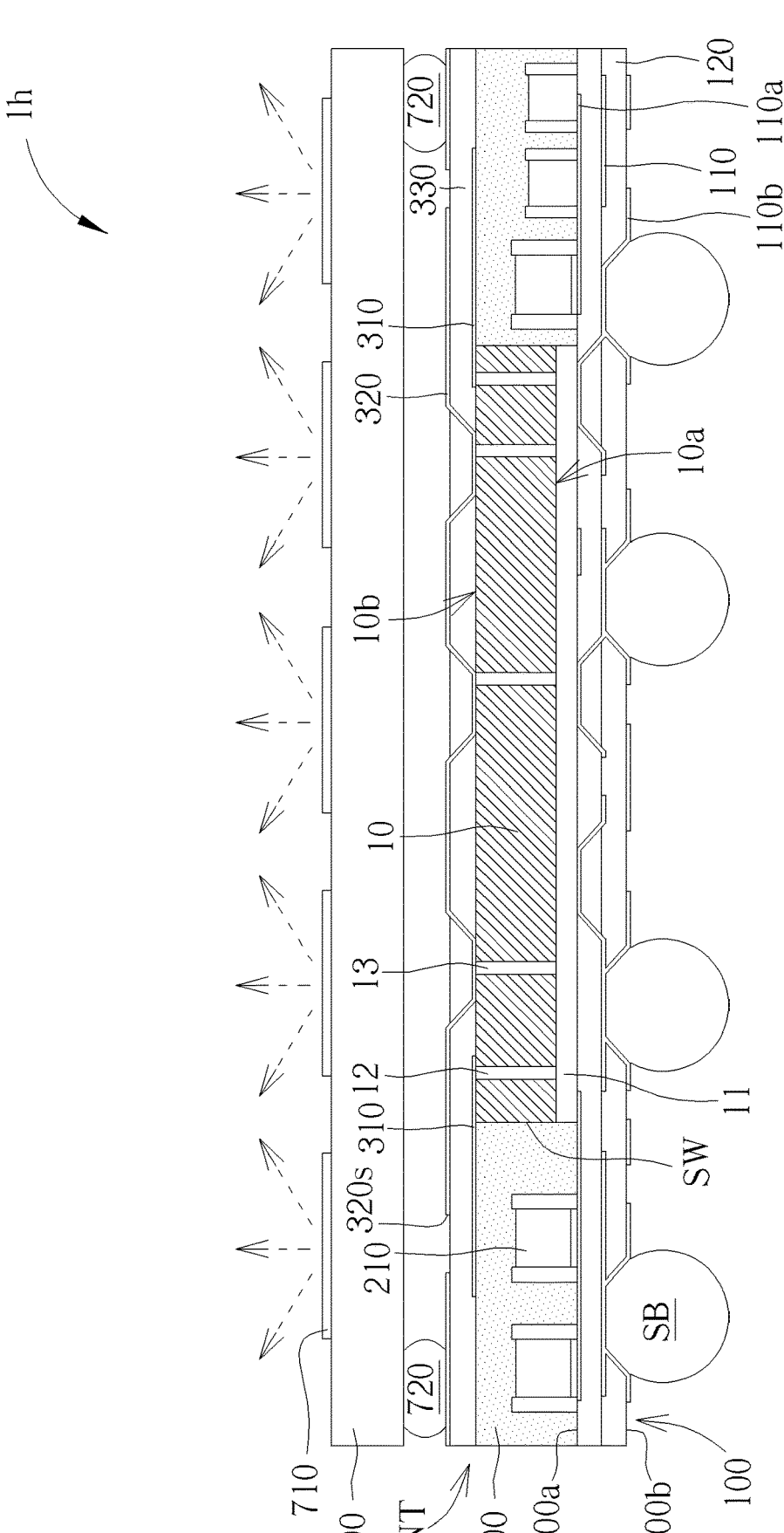
Figure 9:
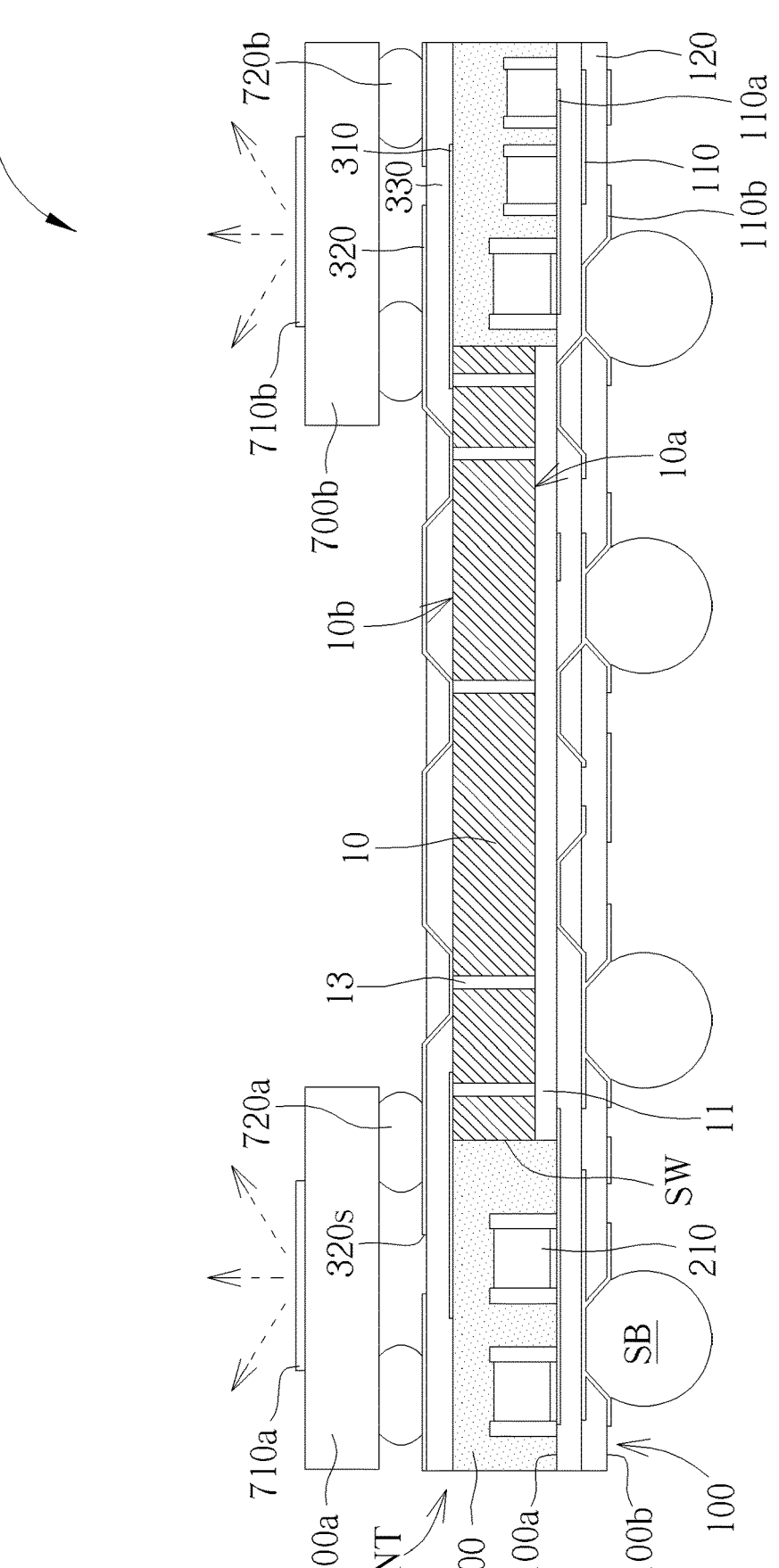

FIG. 4 is a schematic, cross-sectional diagram showing an exemplary ultra-high frequency antenna package in accordance with another embodiment of the invention;

FIG. 5 is a schematic, cross-sectional diagram showing an exemplary ultra-high frequency antenna package in accordance with another embodiment of the invention;

FIG. 6 is a schematic, cross-sectional diagram showing an exemplary ultra-high frequency antenna package in accordance with another embodiment of the invention;

FIG. 7 is a schematic, cross-sectional diagram showing an exemplary ultra-high frequency antenna package in accordance with another embodiment of the invention;

FIG. 8 is a schematic, cross-sectional diagram showing an exemplary ultra-high frequency antenna package in accordance with another embodiment of the invention; and FIG. 9 is a schematic, cross-sectional diagram showing an exemplary ultra-high frequency antenna package in accordance with another embodiment of the invention.

DETAILED DESCRIPTION

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

THz frequency bands from 100 to 300 GHz are considered for 6G communication. The complexity of antenna and chip package design increases at such higher frequencies, which in return creates more challenges in terms of material selection, design process, fabrication techniques, and experimental validations. The present disclosure provides various antenna packages with through-silicon-via (TSV) die for reducing routing loss, which are suited for future 6G applications.

Figure 1:
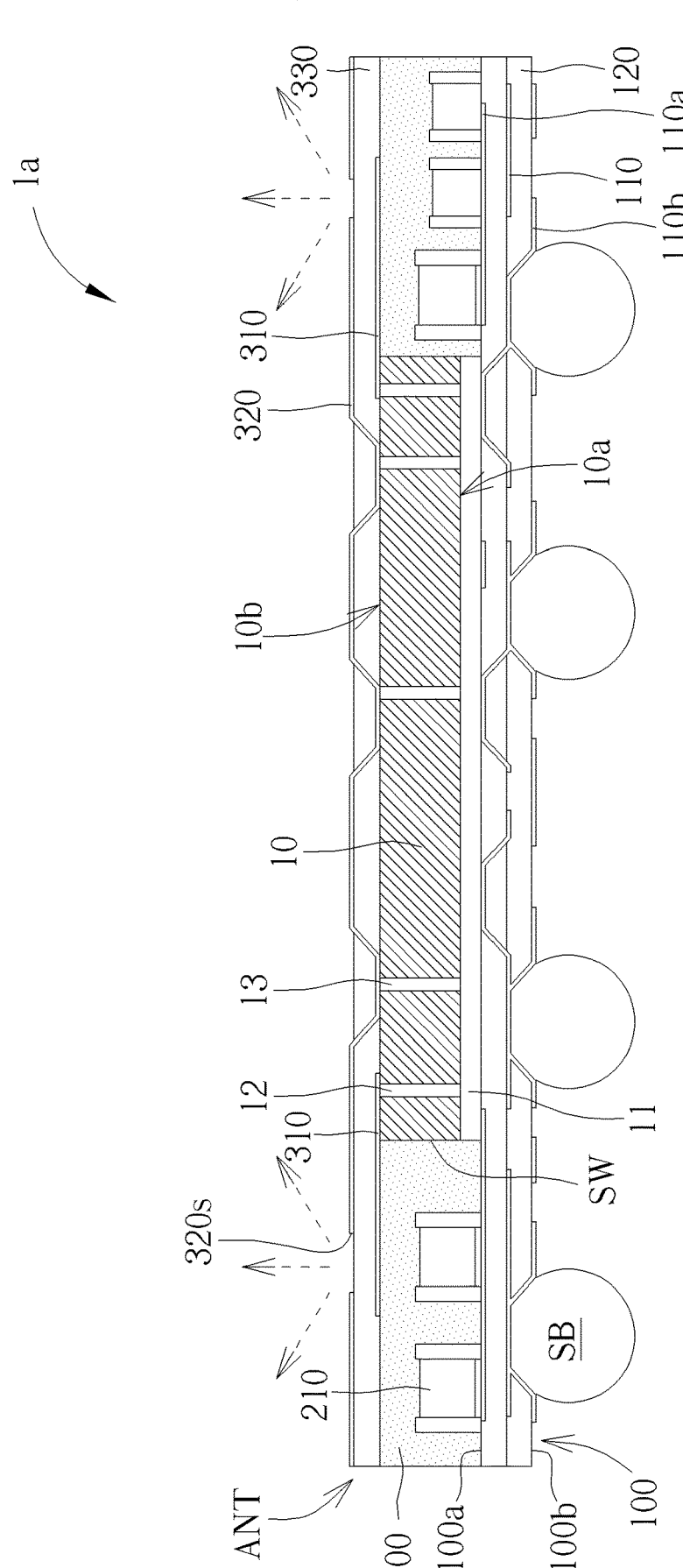
FIG. 1 is a schematic, cross-sectional diagram showing an exemplary ultra-high frequency antenna package in accordance with an embodiment of the invention.

FIG. 1 is a schematic, cross-sectional diagram showing an exemplary ultra-high frequency antenna package in accordance with an embodiment of the invention. As shown in FIG. 1, the antenna package 1a comprises a redistribution layer (RDL) structure 100 having a top surface 100a and a bottom surface 100b opposite to the top surface 100a. According to an embodiment, the RDL structure 100 may include redistributed conductive layers 110 disposed in one or more dielectric layers 120. According to an embodiment, the redistributed conductive layers 110 may comprise connection patterns 110a at the top surface 100a and pad patterns 110b at the bottom surface 100b. According to an embodiment, solder balls SB may be disposed on the pad patterns 110*b* at the bottom surface 100*b* of the RDL structure 100.

According to an embodiment, a TSV die 10 may be disposed on the top surface 100*a* of the RDL structure 100 and encapsulated by an insulating material such as epoxy molding compound 200. According to an embodiment, the TSV die 10 may be electrically connected to the RDL structure 100. The TSV die 10 comprises an active side 10*a* and a rear side 10*b*. The sidewall SW of the TSV die 10 is covered with the epoxy molding compound 200. According to an embodiment, the TSV die 10 may be a radio frequency (RF) chip, which may comprise a baseband processor or an application processor, but is not limited thereto.

According to an embodiment, the TSV die 10 may comprise a circuit region 11 on its active side 10*a*. According to an embodiment, integrated circuit devices such as transistors (not shown) are fabricated within the circuit region 11. The input/output (I/O) terminals in the circuit region 11 may be fanned out of the chip area and re-distributed through the RDL structure 100.

According to an embodiment, the TSV die 10 may comprise a plurality of through-silicon-vias (TSVs) 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10*b* of the TSV die 10.

Although only one integrated circuit die is illustrated in the antenna package 1*a*, it is understood that multiple integrated circuit dies (e.g., a separate baseband chip, processors, memory, etc.) may be integrated in a single semiconductor package in other embodiments depending on package design.

According to an embodiment, the TSV die 10 transmits and receives wireless signals by way of one or more antennas elements of the antenna structure ANT integrated on the rear side 10*b* of the TSV die 10. For example, the antenna structure ANT may be slot-coupling antenna structure comprising feed lines 310 connected to the TSV 12, a ground element layer 320 connected to the TSV 13, coupling slots 320*s* disposed in the ground element layer 320 and directly above the feed lines 310, and a dielectric layer 330.

According to an embodiment, optionally, at least one passive element 210 may be disposed on the top surface 100*a* of the RDL structure 100 around the TSV die 10 and may be coupled to the connection patterns 110*a* at the top surface 100*a* of the RDL structure 100. According to an embodiment, the at least one passive element 210 and the TSV die 10 may be arranged on the RDL structure 100 in a side-by-side manner. According to an embodiment, the at least one passive element 210 may be a surface mount device, but is not limited thereto. According to an embodiment, for example, the at least one passive element 210 may be a decoupling capacitor, an inductor, or a resistor.

Figure 2:
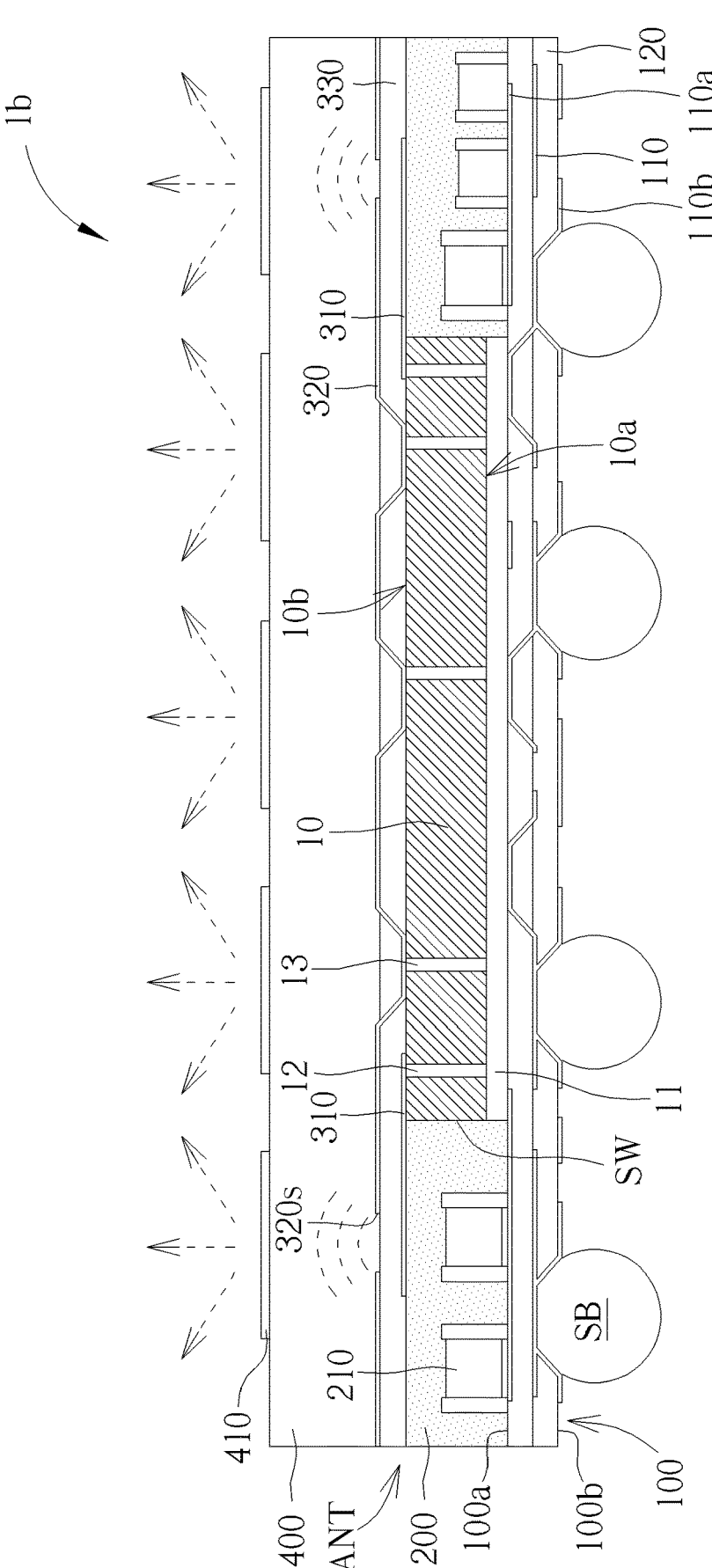
FIG. 2 is a schematic, cross-sectional diagram showing an exemplary ultra-high frequency antenna package in accordance with another embodiment of the invention.

FIG. 2 is a schematic, cross-sectional diagram showing an exemplary ultra-high frequency antenna package in accordance with another embodiment of the invention, wherein like regions, layers or elements are designated by like numeral numbers or labels. As shown in FIG. 2, likewise, the antenna package 1*b* comprises an RDL structure 100 having a top surface 100*a* and a bottom surface 100*b* opposite to the top surface 100*a*. According to an embodiment, the RDL structure 100 may include redistributed conductive layers 110 disposed in one or more dielectric layers 120. According to an embodiment, the redistributed conductive layers 110 may comprise connection patterns 110*a* at the top surface 100*a* and pad patterns 110*b* at the bottom surface 100*b*. According to an embodiment, solder balls SB may be disposed on the pad patterns 110*b* at the bottom surface 100*b* of the RDL structure 100.

According to an embodiment, a TSV die 10 may be disposed on the top surface 100*a* of the RDL structure 100 and encapsulated by an epoxy molding compound 200. According to an embodiment, the TSV die 10 may be electrically connected to the RDL structure 100. The TSV die 10 comprises an active side 10*a* and a rear side 10*b*. The sidewall SW of the TSV die 10 is covered with the epoxy molding compound 200. According to an embodiment, the TSV die 10 may be a radio frequency (RF) chip, which may comprise a baseband processor or an application processor, but is not limited thereto.

According to an embodiment, the TSV die 10 may comprise a circuit region 11 on its active side 10*a*. According to an embodiment, integrated circuit devices such as transistors (not shown) are fabricated within the circuit region 11. The I/O terminals in the circuit region 11 may be fanned out of the chip area and re-distributed through the RDL structure 100.

According to an embodiment, likewise, the TSV die 10 may comprise a plurality of TSVs 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10*b* of the TSV die 10.

According to an embodiment, the TSV die 10 transmits and receives wireless signals by way of one or more antennas elements of the antenna structure ANT integrated on the rear side 10*b* of the TSV die 10. For example, the antenna structure ANT may be slot-coupled patch antenna structure comprising feed lines 310 connected to the TSV 12, a ground element layer 320 connected to the TSV 13, coupling slots 320*s* disposed in the ground element layer 320 and directly above the feed lines 310, a dielectric layer 330, a dielectric layer 400, and radiating elements 410 such as patch elements on the dielectric layer 400. According to an embodiment, the dielectric layer 400 may be an epoxy molding compound, but is not limited thereto.

According to an embodiment, optionally, at least one passive element 210 may be disposed on the top surface 100*a* of the RDL structure 100 around the TSV die 10 and may be coupled to the connection patterns 110*a* at the top surface 100*a* of the RDL structure 100. According to an embodiment, the at least one passive element 210 and the TSV die 10 may be arranged on the RDL structure 100 in a side-by-side manner. According to an embodiment, the at least one passive element 210 may be a surface mount device, but is not limited thereto. According to an embodiment, for example, the at least one passive element 210 may be a decoupling capacitor, an inductor, or a resistor.

Figure 3:
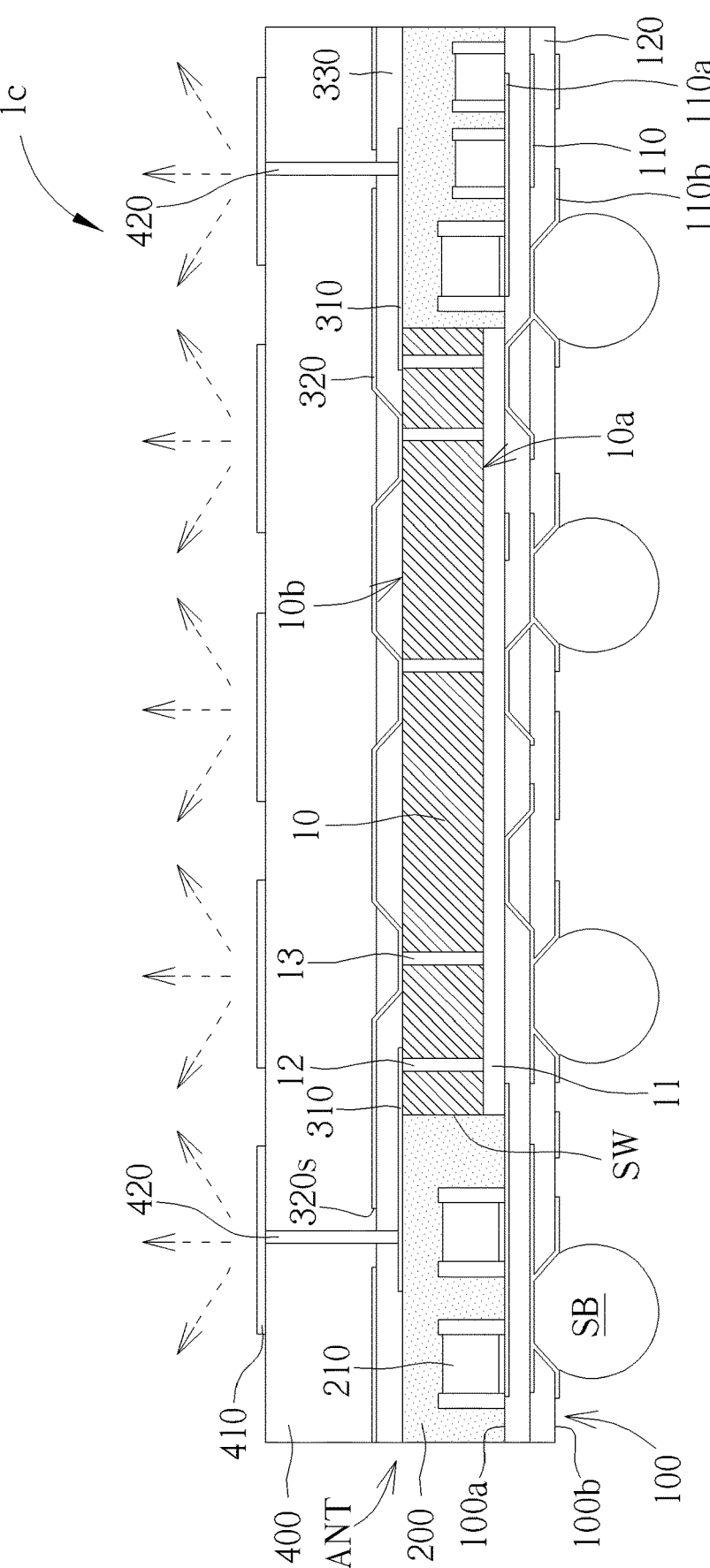
FIG. 3 is a schematic, cross-sectional diagram showing an exemplary ultra-high frequency antenna package in accordance with another embodiment of the invention.

FIG. 3 is a schematic, cross-sectional diagram showing an exemplary ultra-high frequency antenna package in accordance with another embodiment of the invention, wherein like regions, layers or elements are designated by like numeral numbers or labels. As shown in FIG. 3, the difference between the antenna package 1*b* in FIG. 2 and the antenna package 1*c* in FIG. 3 is that the radiating elements 410 of the antenna package 1*c* are directly connected to the feed lines 310 through interconnect structures 420. According to an embodiment, for example, the interconnect structures 420 may comprise copper pillars or through mold vias, but not limited thereto.

FIG. 4 is a schematic, cross-sectional diagram showing an exemplary ultra-high frequency antenna package in accordance with another embodiment of the invention, wherein like regions, layers or elements are designated by like numeral numbers or labels. As shown in FIG. 4, the difference between the antenna package 1c in FIG. 3 and the antenna package 1d in FIG. 4 is that the dielectric layer 400 of the antenna package 1d is a multi-layer structure, for example, a bi-layer structure. According to an embodiment, for example, the dielectric layer 400 may comprise a lower dielectric layer 400a and an upper dielectric layer 400b. According to an embodiment, for example, the lower dielectric layer 400a and the upper dielectric layer 400b may have different compositions. According to an embodiment, for example, the lower dielectric layer 400a and the upper dielectric layer 400b may have different dielectric constants. According to an embodiment, for example, the lower dielectric layer 400a may have a dielectric constant Dk lower than that of the upper dielectric layer 400b. In FIG. 4, the radiating elements 410 of the antenna package 1d are directly connected to the feed lines 310 through interconnect structures 420. According to an embodiment, for example, the interconnect structures 420 may comprise conductive wires, traces, pillars or through mold vias, but not limited thereto.

FIG. 5 is a schematic, cross-sectional diagram showing an exemplary ultra-high frequency antenna package in accordance with another embodiment of the invention, wherein like regions, layers or elements are designated by like numeral numbers or labels. As shown in FIG. 5, likewise, the antenna package 1e comprises an RDL structure 100 having a top surface 100a and a bottom surface 100b opposite to the top surface 100a. According to an embodiment, the RDL structure 100 may include redistributed conductive layers 110 disposed in one or more dielectric layers 120. According to an embodiment, the redistributed conductive layers 110 may comprise connection patterns 110a at the top surface 100a and pad patterns 110b at the bottom surface 100b. According to an embodiment, solder balls SB may be disposed on the pad patterns 110b at the bottom surface 100b of the RDL structure 100.

According to an embodiment, a TSV die 10 may be disposed on the top surface 100a of the RDL structure 100 and encapsulated by an epoxy molding compound 200. According to an embodiment, the TSV die 10 may be electrically connected to the RDL structure 100. The TSV die 10 comprises an active side 10a and a rear side 10b. The sidewall SW of the TSV die 10 is covered with the epoxy molding compound 200. According to an embodiment, the TSV die 10 may be an RF chip, which may comprise a baseband processor or an application processor, but is not limited thereto.

According to an embodiment, the TSV die 10 may comprise a circuit region 11 on its active side 10a. According to an embodiment, integrated circuit devices such as transistors (not shown) are fabricated within the circuit region 11. The I/O terminals in the circuit region 11 may be fanned out of the chip area and re-distributed through the RDL structure 100.

According to an embodiment, likewise, the TSV die 10 may comprise a plurality of TSVs 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10b of the TSV die 10.

According to an embodiment, the TSV die 10 transmits and receives wireless signals by way of one or more antennas elements of the antenna structure ANT integrated on the rear side 10b of the TSV die 10. For example, the antenna structure ANT may be slot-coupled, stacked patch antenna structure comprising feed lines 310 connected to the TSV 12, a ground element layer 320 connected to the TSV 13, coupling slots 320s disposed in the ground element layer 320 and directly above the feed lines 310, a dielectric layer 330, a dielectric layer 400 on the dielectric layer 330, patch elements 410 on the dielectric layer 400, a dielectric layer 500 on the dielectric layer 400, and patch elements 510 on the dielectric layer 500. The slot-coupled, stacked patch antenna structure can improve the bandwidth.

FIG. 6 is a schematic, cross-sectional diagram showing an exemplary ultra-high frequency antenna package in accordance with another embodiment of the invention, wherein like regions, layers or elements are designated by like numeral numbers or labels. As shown in FIG. 6, likewise, the antenna package if comprises an RDL structure 100 having a top surface 100a and a bottom surface 100b opposite to the top surface 100a. According to an embodiment, the RDL structure 100 may include redistributed conductive layers 110 disposed in one or more dielectric layers 120. According to an embodiment, the redistributed conductive layers 110 may comprise connection patterns 110a at the top surface 100a and pad patterns 110b at the bottom surface 100b. According to an embodiment, solder balls SB may be disposed on the pad patterns 110b at the bottom surface 100b of the RDL structure 100.

According to an embodiment, a TSV die 10 may be disposed on the top surface 100a of the RDL structure 100 and encapsulated by an epoxy molding compound 200. According to an embodiment, the TSV die 10 may be electrically connected to the RDL structure 100. The TSV die 10 comprises an active side 10a and a rear side 10b. The sidewall SW of the TSV die 10 is covered with the epoxy molding compound 200. According to an embodiment, the TSV die 10 may be an RF chip, which may comprise a baseband processor or an application processor, but is not limited thereto.

According to an embodiment, the TSV die 10 may comprise a circuit region 11 on its active side 10a. According to an embodiment, integrated circuit devices such as transistors (not shown) are fabricated within the circuit region 11. The I/O terminals in the circuit region 11 may be fanned out of the chip area and re-distributed through the RDL structure 100.

According to an embodiment, likewise, the TSV die 10 may comprise a plurality of TSVs 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10b of the TSV die 10.

According to an embodiment, the TSV die 10 transmits and receives wireless signals by way of one or more antennas elements of the antenna structure ANT integrated on the rear side 10b of the TSV die 10. For example, the antenna structure ANT may be slot-coupled antenna structure comprising feed lines 310 connected to the TSV 12, a ground element layer 320 connected to the TSV 13, coupling slots 320s disposed in the ground element layer 320 and directly above the feed lines 310, a dielectric layer 330, a dielectric layer 600 on the dielectric layer 330, and a planar structure 610 on the dielectric layer 600. According to an embodiment, for example, the planar structure 610 may comprise a frequency selective surface (FSS) structure. According to an embodiment, for example, the planar structure 610 may comprise a metamaterial.

FIG. 7 is a schematic, cross-sectional diagram showing an exemplary ultra-high frequency antenna package in accordance with another embodiment of the invention, wherein like regions, layers or elements are designated by like numeral numbers or labels. As shown in FIG. 7, likewise, the antenna package 1g comprises an RDL structure 100 having a top surface 100a and a bottom surface 100b opposite to the top surface 100a. According to an embodiment, the RDL structure 100 may include redistributed conductive layers 110 disposed in one or more dielectric layers 120. According to an embodiment, the redistributed conductive layers 110 may comprise connection patterns 110a at the top surface 100a and pad patterns 110b at the bottom surface 100b. According to an embodiment, solder balls SB may be disposed on the pad patterns 110b at the bottom surface 100b of the RDL structure 100.

According to an embodiment, a TSV die 10 may be disposed on the top surface 100a of the RDL structure 100 and encapsulated by an epoxy molding compound 200. According to an embodiment, the TSV die 10 may be electrically connected to the RDL structure 100. The TSV die 10 comprises an active side 10a and a rear side 10b. The sidewall SW of the TSV die 10 is covered with the epoxy molding compound 200. According to an embodiment, the TSV die 10 may be an RF chip, which may comprise a baseband processor or an application processor, but is not limited thereto.

According to an embodiment, the TSV die 10 may comprise a circuit region 11 on its active side 10a. According to an embodiment, integrated circuit devices such as transistors (not shown) are fabricated within the circuit region 11. The I/O terminals in the circuit region 11 may be fanned out of the chip area and re-distributed through the RDL structure 100.

According to an embodiment, likewise, the TSV die 10 may comprise a plurality of TSVs 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10b of the TSV die 10.

According to an embodiment, the TSV die 10 transmits and receives wireless signals by way of one or more antennas elements of the antenna structure ANT integrated on the rear side 10b of the TSV die 10. For example, the antenna structure ANT may be slot-coupled patch antenna structure comprising feed lines 310 connected to the TSV 12, a ground element layer 320 connected to the TSV 13, coupling slots 320s disposed in the ground element layer 320 and directly above the feed lines 310, a dielectric layer 330, a dielectric layer 400, radiating elements 410 such as patch elements on the dielectric layer 400, a dielectric layer 600 on the dielectric layer 400, and a planar structure 610 on the dielectric layer 600. According to an embodiment, for example, the planar structure 610 may comprise a frequency selective surface (FSS) structure. According to an embodiment, for example, the planar structure 610 may comprise a metamaterial.

FIG. 8 is a schematic, cross-sectional diagram showing an exemplary ultra-high frequency antenna package in accordance with another embodiment of the invention, wherein like regions, layers or elements are designated by like numeral numbers or labels. As shown in FIG. 8, likewise, the antenna package 1h comprises an RDL structure 100 having a top surface 100a and a bottom surface 100b opposite to the top surface 100a. According to an embodiment, the RDL structure 100 may include redistributed conductive layers 110 disposed in one or more dielectric layers 120. According to an embodiment, the redistributed conductive layers 110 may comprise connection patterns 110a at the top surface 100a and pad patterns 110b at the bottom surface 100b. According to an embodiment, solder balls SB such as C4 bumps may be disposed on the pad patterns 110b at the bottom surface 100b of the RDL structure 100.

According to an embodiment, a TSV die 10 may be disposed on the top surface 100a of the RDL structure 100 and encapsulated by an epoxy molding compound 200. According to an embodiment, the TSV die 10 may be electrically connected to the RDL structure 100. The TSV die 10 comprises an active side 10a and a rear side 10b. The sidewall SW of the TSV die 10 is covered with the epoxy molding compound 200. According to an embodiment, the TSV die 10 may be an RF chip, which may comprise a baseband processor or an application processor, but is not limited thereto.

According to an embodiment, the TSV die 10 may comprise a circuit region 11 on its active side 10a. According to an embodiment, integrated circuit devices such as transistors (not shown) are fabricated within the circuit region 11. The I/O terminals in the circuit region 11 may be fanned out of the chip area and re-distributed through the RDL structure 100.

According to an embodiment, likewise, the TSV die 10 may comprise a plurality of TSVs 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10b of the TSV die 10.

According to an embodiment, the TSV die 10 transmits and receives wireless signals by way of one or more antennas elements of the antenna structure ANT disposed on the rear side 10b of the TSV die 10. For example, the antenna structure ANT may comprise feed lines 310 connected to the TSV 12, a ground element layer 320 connected to the TSV 13, coupling slots 320s disposed in the ground element layer 320 and directly above the feed lines 310, a dielectric layer 330, and an antenna substrate 700 mounted on the ground element layer 320. According to an embodiment, the antenna substrate 700 may comprise radiating elements 710 such as patch elements on the upper surface of the antenna substrate 700. According to an embodiment, the antenna substrate 700 may be electrically connected to the ground element layer 320 through a plurality of conductive elements 720 such as micro-bumps. According to an embodiment, the antenna substrate 700 may be a single-layer substrate or a multi-layer substrate and may comprise glass, ceramic or organic materials.

FIG. 9 is a schematic, cross-sectional diagram showing an exemplary ultra-high frequency antenna package in accordance with another embodiment of the invention, wherein like regions, layers or elements are designated by like numeral numbers or labels. As shown in FIG. 9, likewise, the antenna package 1*i* comprises an RDL structure 100 having a top surface 100*a* and a bottom surface 100*b* opposite to the top surface 100*a*. According to an embodiment, the RDL structure 100 may include redistributed conductive layers 110 disposed in one or more dielectric layers 120. According to an embodiment, the redistributed conductive layers 110 may comprise connection patterns 110*a* at the top surface 100*a* and pad patterns 110*b* at the bottom surface 100*b*. According to an embodiment, solder balls SB such as C4 bumps may be disposed on the pad patterns 110*b* at the bottom surface 100*b* of the RDL structure 100.

According to an embodiment, a TSV die 10 may be disposed on the top surface 100*a* of the RDL structure 100 and encapsulated by an epoxy molding compound 200. According to an embodiment, the TSV die 10 may be electrically connected to the RDL structure 100. The TSV die 10 comprises an active side 10*a* and a rear side 10*b*. The sidewall SW of the TSV die 10 is covered with the epoxy molding compound 200. According to an embodiment, the TSV die 10 may be an RF chip, which may comprise a baseband processor or an application processor, but is not limited thereto.

According to an embodiment, the TSV die 10 may comprise a circuit region 11 on its active side 10*a*. According to an embodiment, integrated circuit devices such as transistors (not shown) are fabricated within the circuit region 11. The I/O terminals in the circuit region 11 may be fanned out of the chip area and re-distributed through the RDL structure 100.

According to an embodiment, likewise, the TSV die 10 may comprise a plurality of TSVs 12 and 13. According to an embodiment, the TSV 12 may be an RF signal via for transmitting ultra-high frequency signals and the TSV 13 may be a ground via for transmitting ground signal. The plurality of TSVs 12 and 13 penetrate through an entire thickness of the TSV die 10 for connecting the circuit region 11 with an antenna structure ANT integrated on the rear side 10*b* of the TSV die 10.

According to an embodiment, the TSV die 10 transmits and receives wireless signals by way of one or more antennas elements of the antenna structure ANT disposed on the rear side 10*b* of the TSV die 10. For example, the antenna structure ANT may comprise feed lines 310 connected to the TSV 12, a ground element layer 320 connected to the TSV 13, coupling slots 320*s* disposed in the ground element layer 320 and directly above the feed lines 310, a dielectric layer 330, multiple antenna substrates 700*a*, 700*b* mounted on the ground element layer 320. According to an embodiment, the antenna substrate 700*a* may comprise radiating elements 710*a* such as patch elements on the upper surface of the antenna substrate 700*a*. According to an embodiment, the antenna substrate 700*b* may comprise radiating elements 710*b* such as patch elements on the upper surface of the antenna substrate 700*b*. According to an embodiment, the antenna substrates 700*a* and 700*b* may be electrically connected to the ground element layer 320 through conductive elements 720*a* and 720*b* such as micro-bumps. According to an embodiment, the antenna substrates 700*a*, 700*b* may be a single-layer substrate or a multi-layer substrate and may comprise glass, ceramic or organic materials.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antenna package, comprising:
   a redistribution layer (RDL) structure having a top surface and a bottom surface opposite to the top surface;
   a through-silicon-via (TSV) die disposed on the top surface of the RDL structure, wherein the TSV die comprises an active side and a rear side, wherein the TSV die comprises a plurality of through-silicon-vias comprising RF signal vias and ground vias penetrating through an entire thickness of the TSV die; and
   an antenna structure disposed on the rear side of the TSV die and connecting to the RF signal vias and ground vias, wherein the antenna structure comprises feed lines connected to the RF signal vias, a ground element layer connected to the ground vias, coupling slots disposed in the ground element layer and directly above the feed lines, a first dielectric layer, a second dielectric layer on the first dielectric layer, and a planar structure on the second dielectric layer, wherein the planar structure comprises a frequency selective surface (FSS) structure or a metamaterial.

2. The antenna package according to claim 1, wherein the RDL structure comprises redistributed conductive layers disposed in one or more dielectric layers.

3. The antenna package according to claim 2, wherein the redistributed conductive layers comprise connection patterns at the top surface and pad patterns at the bottom surface, and wherein solder balls are disposed on the pad patterns at the bottom surface of the RDL structure.

4. The antenna package according to claim 3, wherein at least one passive element is disposed on the top surface of the RDL structure around the TSV die and is coupled to the connection patterns at the top surface of the RDL structure.

5. The antenna package according to claim 4, wherein the at least one passive element comprises a decoupling capacitor, an inductor, or a resistor.

6. The antenna package according to claim 1, wherein the TSV die comprises a radio frequency (RF) chip.

7. The antenna package according to claim 1, wherein the TSV die comprises a circuit region on its active side, and wherein input/output (I/O) terminals in the circuit region are fanned out of a chip area of the TSV die and re-distributed through the RDL structure.

8. The antenna package according to claim 7, wherein the plurality of TSVs connects the circuit region with the antenna structure on the rear side of the TSV die.

9. The antenna package according to claim 1, wherein the TSV die is encapsulated by an insulating material, and a sidewall of the TSV die is covered with the insulating material.

10. The antenna package according to claim 9, wherein the insulating material comprises a molding compound.

* * * * *